(12) United States Patent
Zhang et al.

(10) Patent No.: US 12,090,745 B2
(45) Date of Patent: Sep. 17, 2024

(54) FLEXIBLE DISPLAY MODULE AND ELECTRONIC DEVICE

(71) Applicant: BOE Technology Group Co., Ltd., Beijing (CN)

(72) Inventors: Jiahao Zhang, Beijing (CN); Hong Zhu, Beijing (CN); Xiaofei Luo, Beijing (CN); Zhe Yang, Beijing (CN); Shangchieh Chu, Taiwan (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 178 days.

(21) Appl. No.: 17/914,785

(22) PCT Filed: Nov. 15, 2021

(86) PCT No.: PCT/CN2021/130650
§ 371 (c)(1),
(2) Date: Sep. 27, 2022

(87) PCT Pub. No.: WO2022/134935
PCT Pub. Date: Jun. 30, 2022

(65) Prior Publication Data
US 2023/0138250 A1    May 4, 2023

(30) Foreign Application Priority Data
Dec. 25, 2020 (CN) .......................... 202011563311.0

(51) Int. Cl.
*B32B 7/02* (2019.01)
*B32B 3/14* (2006.01)
(Continued)

(52) U.S. Cl.
CPC .................. *B32B 7/02* (2013.01); *B32B 3/14* (2013.01); *B32B 5/18* (2013.01); *B32B 7/022* (2019.01);
(Continued)

(58) Field of Classification Search
CPC ..... B32B 15/046; B32B 15/18; B32B 27/065; B32B 27/281; B32B 27/40; B32B 3/14;
(Continued)

(56) References Cited

U.S. PATENT DOCUMENTS 10,147,772 B2    12/2018    Breedlove et al.
10,431,635 B2    10/2019    Breedlove et al.
(Continued)

FOREIGN PATENT DOCUMENTS

CN    108463339 A    8/2018
CN    108807474 A    11/2018
(Continued)

OTHER PUBLICATIONS

International Search Report issued Feb. 10, 2022 in International Application No. PCT/CN2021/130650, 4 pages.
(Continued)

*Primary Examiner* — Lawrence D Ferguson
(74) *Attorney, Agent, or Firm* — XSENSUS LLP (57) ABSTRACT

The flexible display module can be curled, and may comprise: a flexible display panel having a display side and a rear side which are provided opposite to each other in a thickness direction of the flexible display panel; a first functional film layer, formed on a display side of the flexible display panel; and a second functional film layer, formed on the rear side of the flexible display panel. The ratio of the thickness of the second functional film layer to the thickness of the first functional film layer is 0.5 to 1.5, and the ratio of the elasticity modulus of the second functional film layer to the elasticity modulus of the first functional film layer is 0.5 to 1.5. The flexible display module is not prone to peeling, losing efficacy and the like.

20 Claims, 7 Drawing Sheets

(51) Int. Cl.
  *B32B 5/18* (2006.01)
  *B32B 7/022* (2019.01)
  *B32B 7/12* (2006.01)
  *B32B 15/04* (2006.01)
  *B32B 15/18* (2006.01)
  *B32B 27/06* (2006.01)
  *B32B 27/28* (2006.01)
  *B32B 27/40* (2006.01)
  *H10K 50/84* (2023.01)
  *H10K 102/00* (2023.01)

(52) U.S. Cl.
  CPC .............. *B32B 7/12* (2013.01); *B32B 15/046* (2013.01); *B32B 15/18* (2013.01); *B32B 27/065* (2013.01); *B32B 27/281* (2013.01); *B32B 27/40* (2013.01); *H10K 50/84* (2023.02); *H10K 50/841* (2023.02); *B32B 2250/05* (2013.01); *B32B 2307/42* (2013.01); *B32B 2307/54* (2013.01); *B32B 2307/56* (2013.01); *B32B 2307/732* (2013.01); *B32B 2457/20* (2013.01); *H10K 2102/311* (2023.02)

(58) Field of Classification Search
  CPC .. B32B 5/18; B32B 7/02; B32B 7/022; B32B 7/12; B32B 2250/05; B32B 2307/42; B32B 2307/54; B32B 2307/546; B32B 2307/56; B32B 2307/732; B32B 2307/7376; B32B 2457/20; B32B 27/08; G09F 9/301; G09F 9/33; H10K 2102/311; H10K 50/84; H10K 50/841; H10K 50/844; H10K 50/86; H10K 77/111; Y02E 10/549
  See application file for complete search history.

(56) References Cited

U.S. PATENT DOCUMENTS

| | | |
|---|---|---|
| 10,522,782 B2 | 12/2019 | Im et al. |
| 2018/0061893 A1 | 3/2018 | Breedlove et al. |
| 2018/0123083 A1 | 5/2018 | Im et al. |
| 2019/0051705 A1 | 2/2019 | Breedlove et al. |

FOREIGN PATENT DOCUMENTS

| | | |
|---|---|---|
| CN | 109801561 A | 5/2019 |
| CN | 110323253 A | 10/2019 |
| CN | 210429822 U | 4/2020 |
| CN | 111724680 A | 9/2020 |
| CN | 111816077 A | 10/2020 |
| CN | 112017547 A | 12/2020 |
| CN | 112068735 A | 12/2020 |
| CN | 212229977 U | 12/2020 |
| CN | 112582575 A | 3/2021 |
| CN | 214625094 U | 11/2021 |
| EP | 3 504 741 B1 | 1/2021 |
| KR | 2017-0026055 A | 3/2017 |
| WO | 2018/037311 A1 | 3/2018 |

OTHER PUBLICATIONS

Written Opinion of the International Searching Authority issued Feb. 10, 2022 in International Application No. PCT/CN2021/130650, 4 pages.

Office Action issued on May 21, 2024, in corresponding Chinese patent Application No. 202011563311.0, 13 pages.

FLEXIBLE DISPLAY MODULE AND ELECTRONIC DEVICE

CROSS-REFERENCE TO RELATED APPLICATION

The present application is a 35 U.S.C. 371 national phase application of PCT International Application No. PCT/CN2021/130650, filed on Nov. 15, 2021, which claims priority to a Chinese patent application with application number 202011563311.0, filed on Dec. 25, 2020 and entitled by "Flexible Display Module and Electronic Device", the entire contents of both are incorporated herein by reference in their entireties.

TECHNICAL FIELD

The present disclosure relates to the field of display technology, and in particular, to a flexible display module and an electronic device.

BACKGROUND

With the development of Organic Light Emission Diode (OLED) display technology in recent years, products and researches on flexible display panels with for example curved surfaces and foldable features have received more and more attention.

At present, a flexible display module has multiple film layers, and the multiple film layers are adhered by glue. However, during the curling process, a dislocation phenomenon occurs between the respective film layers. That is, a strain accumulation phenomenon occurs. The thicker the curling module, the more the number of curling turns, and the more serious the strain accumulation of the film layers. The strain accumulation in the curling process is mainly absorbed by adhesive materials. If the strain accumulation reaches the limit value, the phenomenon of peeling will occur, and the key layers of the module (such as inorganic encapsulation layer, back plate, etc.) are prone to fracture and fail.

It should be noted that the information disclosed in the above Background section is only for enhancement of understanding of the background of the present disclosure, and therefore may contain information that does not constitute the prior art that is already known to a person of ordinary skill in the art.

SUMMARY

The purpose of the present disclosure is to provide a flexible display module and an electronic device, so as to overcome, at least to a certain extent, one or more problems caused by limitations and defects in the prior art.

A first aspect of the present disclosure provides a flexible display module, which is capable of curling. The flexible display module includes: a flexible display panel, having a display side and a rear side disposed opposite to each other in its thickness direction; a first functional film layer, formed on the display side of the flexible display panel; and a second functional film layer, formed on the rear side of the flexible display panel.

The ratio of the thickness of the second functional film layer to the thickness of the first functional film layer is from 0.5 to 1.5, and the ratio of the elasticity modulus of the second functional film layer to the elasticity modulus of the first functional film layer is from 0.5 to 1.5.

In an exemplary embodiment of the present disclosure, when the display side of the flexible display panel is closer to the outer curling side than the rear side thereof, the ratio of the thickness of the second functional film layer to the thickness of the first functional film layer is from 0.5 to 1, and the ratio of the elasticity modulus of the second functional film layer to the elasticity modulus of the first functional film layer is from 0.5 to 1.

Alternatively, when the display side of the flexible display panel is closer to the inner curling side than the rear side thereof, the ratio of the thickness of the second functional film layer to the thickness of the first functional film layer is from 1 to 1.5, and the ratio of the elasticity modulus of the second functional film layer to the elasticity modulus of the first functional film layer is from 1 to 1.5.

In an exemplary embodiment of the present disclosure, the thickness of the second functional film layer is equal to the thickness of the first functional film layer, and the elasticity modulus of the second functional film layer is the same as the elasticity modulus of the first functional film layer.

In an exemplary embodiment of the present disclosure, the elasticity modulus of the first functional film layer and the elasticity modulus of the second functional film layer are from 4 Gpa to 8 Gpa.

In an exemplary embodiment of the present disclosure, the first functional film layer includes a flexible cover plate and a first adhesive layer. The flexible cover plate is adhered to the display side of the flexible display panel through the first adhesive layer.

The second functional film layer includes a first support back film and a second adhesive layer. The first support back film is adhered to the rear side of the flexible display panel through the second adhesive layer.

In an exemplary embodiment of the present disclosure, the thickness of the flexible cover plate and the thickness of the first support back film are from 40 µm to 60 µm, and the elasticity modulus of the flexible cover plate and the elasticity modulus of the first support back film are from 4 Gpa to 8 Gpa.

The thickness of the first adhesive layer and the thickness of the second adhesive layer are from 10 µm to 50 µm, and the elasticity modulus of the first adhesive layer and the elasticity modulus of the second adhesive layer are from 20 Mpa to 100 Mpa.

In an exemplary embodiment of the present disclosure, the first functional film layer further includes a impact absorption layer and a third adhesive layer. The impact absorption layer is adhered to a side of the flexible cover plate away from the flexible display panel through the third adhesive layer.

The second functional film layer further includes a first buffer layer and a patterned metal layer. The first buffer layer is located on a side of the first support back film away from the flexible display panel. The patterned metal layer is located on the side of the first buffer layer away from the first support back film.

The elasticity modulus of the impact absorption layer is smaller than the elasticity modulus of the flexible cover plate. The elasticity modulus of the first buffer layer and the elasticity modulus of the patterned metal layer are smaller than the elasticity modulus of the first support back film.

In an exemplary embodiment of the present disclosure, the thickness of the impact absorption layer is from 100 µm to 200 µm, and the elasticity modulus of the impact absorption layer is from 10 Mpa to 200 Mpa.

The thickness of the third adhesive layer is from 10 μm to 50 μm, and the elasticity modulus of the third adhesive layer is from 20 Mpa to 100 Mpa.

The thickness of the first buffer layer is from 80 μm to 120 μm, the thickness of the patterned metal layer is from 100 μm to 200 μm, and the elasticity modulus of the first buffer layer and the elasticity modulus of the patterned metal layer are from 10 Mpa to 200 Mpa.

In an exemplary embodiment of the present disclosure, the materials of the flexible cover plate and the first support back film include polyimide organic materials.

The material of the impact absorption layer includes a polyurethane organic material. The materials of the first adhesive layer, the second adhesive layer, and the third adhesive layer include optical adhesives or pressure-sensitive adhesives.

The material of the first buffer layer includes a foam, and glue materials are provided on both sides of the foam to be respectively adhered to the first support back film and the patterned metal layer. The material of the patterned metal layer includes stainless steel.

In an exemplary embodiment of the present disclosure, the second functional film layer further includes a second buffer layer, and the second buffer layer is located on a side of the patterned metal layer away from the first buffer layer.

The elasticity modulus of the second buffer layer is smaller than the elasticity modulus of the first support back film.

In an exemplary embodiment of the present disclosure, the patterned metal layer includes a first metal layer, a sixth adhesive layer located on a side of the first metal layer away from the first buffer layer, and a second metal layer located on a side of the sixth adhesive layer away from the first metal layer.

The second metal layer includes a plurality of metal pattern portions arranged at intervals, and the metal pattern portions extend upward in the curling axis of the flexible display module.

In an exemplary embodiment of the present disclosure, the first functional film layer further includes a polarizer and a fourth adhesive layer. The polarizer is adhered to a side of the first adhesive layer close to the flexible display panel, and is further adhered to the display side of the flexible display panel through the fourth adhesive layer.

The second functional film layer further includes a second support back film and a fifth adhesive layer. The second support back film is adhered to the rear side of the first support back film through the fifth adhesive layer.

In an exemplary embodiment of the present disclosure, the polarizer and the second support back film have a thickness from 40 μm to 60 μm, and the elasticity modulus of the polarizer and the elasticity modulus of the second support back film are from 4 Gpa to 8 Gpa.

The thickness of the fourth adhesive layer and the thickness of the fifth adhesive layer are from 10 μm to 50 μm, and the elasticity modulus of the fourth adhesive layer and the elasticity modulus of the fifth adhesive layer are from 20 Mpa to 100 Mpa.

In an exemplary embodiment of the present disclosure, the material of the second support back film includes a polyimide organic material, and the materials of the fourth adhesive layer and the fifth adhesive layer include optical adhesives or pressure-sensitive adhesives.

In an exemplary embodiment of the present disclosure, the first functional film layer includes a polarizer and a fourth adhesive layer. The polarizer is adhered to the display side of the flexible display panel through the fourth adhesive layer.

The second functional film layer includes a second support back film and a fifth adhesive layer, and the second support back film is adhered to the rear side of the flexible display panel through the fifth adhesive layer.

A second aspect of the present disclosure provides an electronic device, including the flexible display module described in any one of the above embodiments.

Other features and advantages of the present disclosure will become apparent from the following detailed description, or be learned in part by practice of the present disclosure.

It is to be understood that the foregoing general description and the following detailed description are exemplary and explanatory only and are not restrictive of the present disclosure.

BRIEF DESCRIPTION OF THE DRAWINGS

The accompanying drawings, which are incorporated in and constitute a part of the specification, illustrate embodiments consistent with the present disclosure and together with the description serve to explain the principle of the present disclosure. Obviously, the drawings in the following description are only some embodiments of the present disclosure, and for those of ordinary skill in the art, other drawings may also be obtained from these drawings without creative effort.

DETAILED DESCRIPTION OF THE EMBODIMENTS

The technical solutions of the present disclosure will be further specifically described below through embodiments and in conjunction with the accompanying drawings. In the specification, the same or similar reference numerals refer to the same or similar parts. The following description of embodiments of the present disclosure with reference to the accompanying drawings is intended to explain the general inventive concept of the present disclosure, and should not be construed as a limitation of the present disclosure.

Furthermore, in the following detailed description, for convenience of explanation, numerous specific details are set forth in order to provide a thorough understanding of embodiments of the present disclosure. Obviously, however, one or more embodiments may be practiced without these specific details.

Unless otherwise defined, technical or scientific terms used in the present disclosure shall have the ordinary meaning as understood by one of ordinary skill in the art to which the present disclosure belongs. As used in the present disclosure, "first," "second," and similar terms do not denote any order, quantity, or importance, but are merely used to distinguish the various components.

Use of words like "comprising" or "having" in the present disclosure means that the elements or items appearing before such words encompass the elements or items listed after such words and their equivalents, but do not exclude other elements or items.

Embodiments of the present disclosure provide a flexible display module, which can perform morphological changes such as curling, bending, and folding.

The flexible display module according to an embodiment of the present disclosure may include a flexible display panel, a first functional film layer and a second functional film layer. The flexible display panel may have a display side and a rear side disposed opposite to each other in the thickness direction of the flexible display panel. For example, the flexible display panel may be an OLED display panel to ensure good properties such as curling and bending. The first functional film layer may be formed on the display side of the flexible display panel, and the second functional film layer may be formed on the rear side of the flexible display panel.

The structures of the flexible display modules according to different embodiments of the present disclosure will be described in detail below with reference to the accompanying drawings.

Embodiment 1

Figure 1:
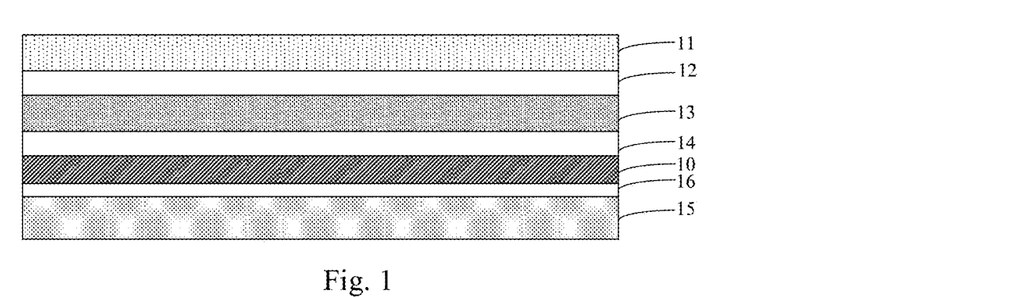
FIGS. 1 to 6 respectively show schematic structural diagrams of a flexible display module in Embodiments 1 to 6.

As shown in FIG. 1, the flexible display panel 10 may include an inorganic buffer film layer, a back plate, an encapsulation layer (not shown in the figures) and the like stacked in sequence. It should be understood that the back plate may include a driving circuit layer and an organic light-emitting device. The driving circuit layer may include inorganic insulation stacks, transistors, storage capacitors, signal lines, etc. The organic light-emitting devices may include anodes, organic light-emitting materials, cathodes, etc. In addition, the back plate may also include a planarization layer, a pixel definition layer, spacers, and the like made of organic materials. The encapsulation layer may be a single-layer structure made of inorganic materials, or a composite layer. That is, the encapsulation layer may include a first inorganic encapsulation layer, an organic encapsulation layer and a second inorganic encapsulation layer stacked in sequence. The first inorganic encapsulation layer is closer to the organic light-emitting device than the second inorganic encapsulation layer.

The first functional film layer may include a flexible cover plate 11, a first adhesive layer 12, a polarizer 13 and a fourth adhesive layer 14. The flexible cover plate 11 may be adhered to the display side of the flexible display panel 10 through the first adhesive layer 12. The polarizer 13 is adhered to the side of the first adhesive layer 12 close to the flexible display panel 10, and is further adhered to the display side of the flexible display panel 10 through the fourth adhesive layer 14. The second functional film layer may include a first support back film 15 and a second adhesive layer 16. The first support back film 15 is adhered to the rear side of the flexible display panel 10 through the second adhesive layer 16.

In an embodiment, the overall thickness and the elasticity modulus of the first functional film layer are much larger than the overall thickness and the elasticity modulus of the second functional film layer. That is, the overall thickness and the elasticity modulus of the first functional film layer are more than two times of the overall thickness and the elasticity modulus of the second functional film layer. It may be understood that the film layer structures on both sides of the flexible display panel 10 according to an embodiment of the present disclosure are overall asymmetrically designed.

For example, the first adhesive layer 12 in an embodiment may be an optical adhesive, but not limited thereto. The first adhesive layer 12 may also be a pressure-sensitive adhesive, etc. The second adhesive layer 16 and the fourth adhesive layer 14 may be pressure-sensitive adhesives, but not limited thereto, and they may also be optical adhesives, depending on the specific situations.

Embodiment 2

The main difference from Embodiment 1 is as below.

The overall design of the first functional film layer and the second functional film layer is different from the design in Embodiment 1, and the other designs (for example, the structure of the flexible display panel 10) may be the same as that in Embodiment 1, but not limited to this, and may also be different, depending on the specific situations.

In an embodiment of the present disclosure, the ratio of the thickness of the second functional film layer to the thickness of the first functional film layer is from 0.5 to 1.5, and the ratio of the elasticity modulus of the second functional film layer to the elasticity modulus of the first functional film layer is from 0.5 to 1.5. That is, the thickness of one of the first functional film layer and the second functional film layer cannot be less than half the thickness of the other, and the elasticity modulus of one of the first functional film layer and the second functional film layer cannot be less than half the elasticity modulus of the other. This design helps to ensure that the overall thickness and the elasticity modulus of the film layer structures on both sides of the flexible display panel 10 are similar. That is, it may be understood that the film layer structures on both sides of the flexible display panel 10 are symmetrical as a whole.

Since the film layer structures on both sides of the flexible display panel 10 in an embodiment of the present disclosure are generally symmetrically designed, compared with the asymmetrical design mentioned in Embodiment 1, this embodiment helps to ensure that similar strain absorption capabilities are provided on both sides of the flexible display panel 10 during the curling process. That is, the strain absorption capabilities on both sides of the flexible display panel 10 are balanced, so that the key layers of the flexible display panel 10 (i.e., inorganic buffer film layer, back plate, inorganic encapsulation layer, etc.) and the degree of strain accumulation of the functional film layers on both sides with the increasing number of curling turns is greatly reduced. This helps to alleviate or avoid the peeling of the flexible display panel 10 and the film layer structures on both sides thereof during the curling process. Besides, the case where the key layers of the flexible display panel 10 are broken and fail may also be alleviated or avoided during the curling process. That is, the entire flexible display module can meet the performance requirements of curling, and the product quality is improved.

It should be noted that the aforementioned symmetrical design includes, but is not limited to, the approximate thickness and the approximate elasticity modulus, and may also include the approximate material properties and the like.

For example, when the flexible display module is an outward curling product, that is, when the display side of the flexible display panel 10 is closer to the outer curling side than its rear side, or when the second functional film layer of the flexible display module is located on the inner curling layer and the first functional film layer is located on the outer curling layer, in order to meet the curling performance requirements of the flexible display module, the thickness of the second functional film layer may be made less than or equal to the thickness of the first functional film layer, and the thickness of the second functional film layer may be made greater than or equal to half of the thickness of the first functional film layer. That is, the ratio of the thickness of the second functional film layer to the thickness of the first functional film layer may be from 0.5 to 1, for example, 0.5, 0.6, 0.7, 0.8, 0.9, 1, etc. At the same time, the elasticity modulus of the second functional film layer is made less than or equal to the elasticity modulus of the first functional film layer, and the elasticity modulus of the second functional film layer is further made greater than or equal to half of the elasticity modulus of the first functional film layer. That is, the ratio of the elasticity modulus of the second functional film layer to the elasticity modulus of the first functional film layer is from 0.5 to 1, such as 0.5, 0.6, 0.7, 0.8, 0.9, 1, etc. In this way, while ensuring the good curling performance of the second functional film layer, the degree of strain accumulation, with the increasing number of curling turns, of the key layers of the flexible display panel 10 and the functional film layers on both sides of the flexible display panel 10 may also be greatly reduced. This helps to alleviate or avoid the case where the flexible display panel and the film layer structures on both sides of the flexible display panel 10 are peeled off during the curling process. In addition, the key layers of the flexible display panel 10 may be relieved or prevented from being broken and thus failing during the curling process.

Similarly, when the flexible display module is an inward curling product, that is, when the display side of the flexible display panel 10 is closer to the outer curling side than its rear side, the thickness of the first functional film layer may be made less than or equal to the thickness of the second functional film layer, and the thickness of the first functional film layer is further made greater than or equal to half of the thickness of the second functional film layer. That is, the ratio of the thickness of the second functional film layer to the thickness of the first functional film layer may be from 1 to 1.5, such as 1, 1.1, 1.2, 1.3, 1.4, 1.5, etc. At the same time, the elasticity modulus of the first functional film layer is made less than or equal to the elasticity modulus of the second functional film layer, and the elasticity modulus of the first functional film layer is further made greater than or equal to half of the elasticity modulus of the second functional film layer. That is, the ratio of the elasticity modulus of the second functional film layer to the elasticity modulus of the first functional film layer may be from 1 to 1.5, for example, 1, 1.1, 1.2, 1.3, 1.4, 1.5, etc.

In an embodiment of the present disclosure, the overall elasticity modulus of the first functional film layer and the overall elasticity modulus of the second functional film layer may be from 4 Gpa to 8 Gpa, such as 4 Gpa, 5 Gpa, 6 Gpa, 7 Gpa, 8 Gpa, etc. The design not only meets the functional requirements of the first functional film layer and the second functional film layer, but also ensures the curling performance of the first functional film layer and the second functional film layer, so as to meet the curling requirements.

In order to make the flexible display module meet the requirements for inward curling and outward curling at the same time, that is, regardless of the flexible display module being curled inwardly or outwardly, the degree of strain accumulation of the key layers of the flexible display panel 10 and the functional film layers on both sides of the flexible display panel 10 with the increasing number of curling turns will be greatly reduced, in an embodiment of the present disclosure, the thickness of the second functional film layer may be equal to the thickness of the first functional film layer, and the elasticity modulus of the second functional film layer is equal to the elasticity modulus of the first functional film layer.

Figure 2:
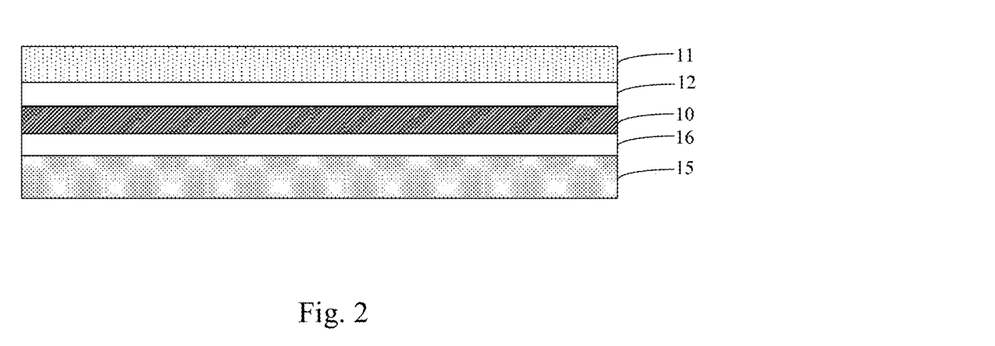

For example, as shown in FIG. 2, the first functional film layer in an embodiment of the present disclosure may include a flexible cover plate 11 and a first adhesive layer 12. The flexible cover plate 11 may be adhered to the display side of the flexible display panel 10 through the first adhesive layer 12. The second functional film layer may include a first support back film 15 and a second adhesive layer 16. The first support back film 15 is adhered to the rear side of the flexible display panel 10 through the second adhesive layer 16.

Optionally, the thickness of the flexible cover plate 11 and the first support back film 15 may be from 40 μm to 60 μm, such as 40 μm, 45 μm, 50 μm, 55 μm, 60 μm, etc. The elasticity modulus of the flexible cover plate 11 and the elasticity modulus of the first support back film 15 may be from 4 Gpa to 8 Gpa, such as 4 Gpa, 5 Gpa, 6 Gpa, 7 Gpa, 8 Gpa, etc. This design not only meets the protection function requirements of the flexible cover 11 and the first support back film 15, but also ensures the curling properties of the flexible cover plate 11 and the first support back film 15, thereby meeting the curling requirements of the entire flexible display module.

The thickness of the first adhesive layer 12 and the thickness of the second adhesive layer 16 may be from 10 μm to 50 μm, such as 10 μm, 20 μm, 30 μm, 40 μm, 50 μm, etc. The elasticity modulus of the first adhesive layer 12 and the elasticity modulus of the second adhesive layer 16 may be from 20 Mpa to 100 Mpa, such as 20 Mpa, 40 Mpa, 60 Mpa, 80 Mpa, 100 Mpa, etc. In addition to the adhesive stability between the first adhesive layer 12 and the second adhesive layer 16, this design further ensures the curling performances of the first adhesive layer 12 and the second adhesive layer 16, so as to meet the curling requirements of the entire flexible display module.

For example, the flexible cover plate 11 and the first support back film 15 may be a single-layer structure or a multi-layer composite structure. When the flexible cover plate 11 and the first support back film 15 are single-layer structures, the material of the flexible cover plate 11 and the material of the first support back film 15 may include polyimide (PI) organic materials, to ensure that the flexible cover plate 11 and the first support back film 15 have good flexibility, but not limited to this. The flexible cover plate 11 and the first support back film may also be made of other materials, such as polyethylene terephthalate (PET), polyimide (CPI) and other organic materials, depending on the specific situations. When the flexible cover plate 11 and the first support back film 15 are multi-layer composite structures, part of the film layers of the flexible cover plate 11 and the first support back film 15 may be organic film layers such as PI, and the other part may be a ultra-thin glass film layer. The ultra-thin glass film layer may be sandwiched between two PI organic film layers.

In addition, the flexible cover plate 11 may include a hard coating layer disposed away from the flexible display panel, so as to protect the flexible cover plate 11.

The material of the first adhesive layer 12 and the material of the second adhesive layer 16 may be optical adhesives (OCA), so that the adhesive layer may also have good optical properties while ensuring the adhesive stability.

It should be noted that since the second adhesive layer 16 is located on the rear side of the flexible display panel 10, the second adhesive layer 16 may not use OCA as the adhesive material, but other adhesive materials, such as pressure-sensitive adhesives (PSA)), which helps to reduce the cost while ensuring the adhesive stability.

In addition, when the second adhesive layer 16 is a pressure-sensitive adhesive and the first adhesive layer 12 is OCA, the thickness of the second adhesive layer 16 may be smaller than the thickness of the first adhesive layer 12. For example, the thickness of the first adhesive layer 12 may be 50 μm, and the thickness of the second adhesive layer 16 may be 25 μm, etc. This helps to reduce the thickness of the flexible display module while ensuring the curling performance of the flexible display module.

Embodiment 3

The main difference from Embodiment 2 is as follows.

Figure 3:
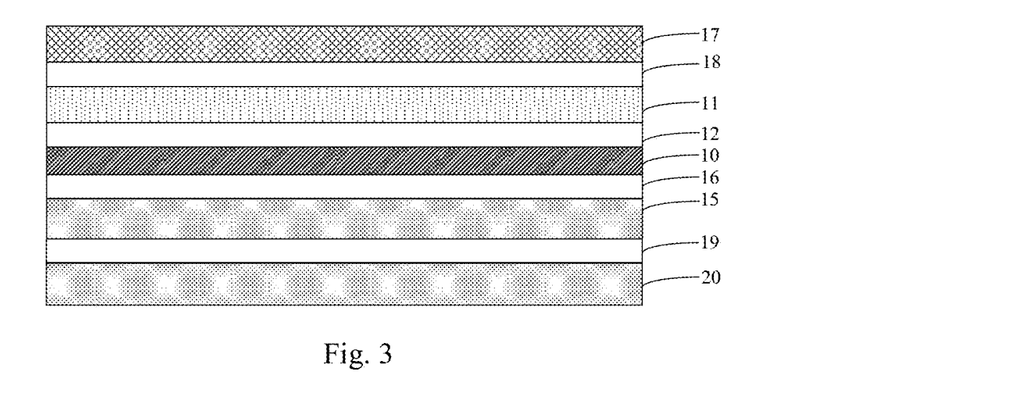

On the basis of Embodiment 2, as shown in FIG. 3, in addition to the flexible cover plate 11 and the first adhesive layer 12 mentioned in Embodiment 2, the first functional film layer may also include an impact absorption layer 17 and a third adhesive layer 18. The impact absorption layer 17 is adhered to a side of the flexible cover plate 11 away from the flexible display panel 10 through the third adhesive layer 18. The elasticity modulus of the impact absorption layer 17 may be smaller than that of the flexible cover plate 11. While ensuring the curling performance, the design also helps to improve the impact resistance on the display side of the flexible display module, and ensure that the functionality of the flexible display module is not damaged. That is, performations such as the pen and ball drop performation of the flexible display module are improved. This helps to enhance the mechanical performance and the display effect of the flexible display module, broaden the scope of application and practical application of the curling module, and provide experience and theoretical guidance for the stacking design of the subsequent curling modules.

Meanwhile, as shown in FIG. 3, in addition to the first support back film 15 and the second adhesive layer 16 mentioned in Embodiment 2, the second functional film layer may also include a first buffer layer 19 and a patterned metal layer 20. The first buffer layer 19 may be located on a side of the first support back film 15 away from the flexible display panel 10. The patterned metal layer may be located on a side of the first buffer layer 19 away from the first support back film 15. The elasticity modulus of the first buffer layer 19 and the elasticity modulus of the patterned metal layer 20 are smaller than the elasticity modulus of the first support back film 15. This design helps to improve the impact resistance and support flatness performance on the rear side of the flexible display module while ensuring the curling performance, thereby enhancing the mechanical properties of the curling module.

In addition, in an embodiment, while the impact absorption layer 17 and the third adhesive layer 18 are added to the first functional film layer, the first buffer layer 19 and the patterned metal layer 20 are added to the second functional film layer. This helps to ensure the first functional film layer and the second functional film layer maintain a symmetrical design as a whole, so that the degree of strain accumulation of the key layers of the flexible display panel 10 and the functional film layers on both sides of the flexible display panel 10 with the increasing number of curling turns may be greatly reduced. This helps to alleviate or avoid peeling off of the flexible display panel 10 and the film layer structures on both sides thereof during the curling process. Besides, this further helps to alleviate or avoid the key layers of the flexible display panel 10 from being broken and thus failing during the curling process.

For example, the thickness of the impact absorption layer 17 in an embodiment may be from 100 μm to 200 μm, such as 100 μm, 120 μm, 140 μm, 160 μm, 180 μm, 200 μm, etc. The elasticity modulus of the impact absorption layer 17 may be from 10 Mpa to 200 Mpa, for example, 10 Mpa, 48 Mpa, 86 Mpa, 124 Mpa, 162 Mpa, 200 Mpa. This design not only ensures the buffer performance of the impact absorption layer 17, but also ensures the curling performance of the impact absorption layer 17, thereby meeting the curling requirements of the entire flexible display module.

The thickness of the first buffer layer 19 may be from 80 μm to 120 μm, such as 80 μm, 90 μm, 100 μm, 110 μm, 120 μm, etc. The elasticity modulus of the first buffer layer 19 may be from 10 Mpa to 200 Mpa, such as 10 Mpa, 48 Mpa, 86 Mpa, 124 Mpa, 162 Mpa, 200 Mpa. This design helps to ensure the buffer performance of the first buffer layer 19, and also ensure the curling performance of the first buffer layer 19, so as to meet the curling requirements of the entire flexible display module.

The thickness of the patterned metal layer 20 may be from 100 μm to 200 μm, such as 100 μm, 120 μm, 140 μm, 160 μm, 180 μm, 200 μm, etc. The elasticity modulus of the patterned metal layer 20 may be from 10 Mpa to 200 Mpa, such as 10 Mpa, 48 Mpa, 86 Mpa, 124 Mpa, 162 Mpa, 200 Mpa. This design not only ensures the support performance of the patterned metal layer 20, but also ensures the curling performance of the third adhesive layer 18, so as to meet the curling requirements of the entire flexible display module.

The thickness of the third adhesive layer 18 may be from 10 μm to 50 μm, such as 10 μm, 20 μm, 30 μm, 40 μm, 50 μm, etc. The elasticity modulus of the third adhesive layer 18 may be from 20 Mpa to 100 Mpa, such as 20 Mpa, 40 Mpa, 60 Mpa, 80 Mpa, 100 Mpa, etc. This design not only ensures the adhesive stability of the third adhesive layer 18, but also ensures the curling performance of the third adhesive layer 18, so as to meet the curling requirements of the entire flexibility display module.

The material of the impact absorption layer 17 may be a polyurethane organic material, but it is not limited thereto, and it may also be other organic materials. The material of the third adhesive layer 18 may be an optical adhesive, so as to ensure the good optical properties. But the present disclosure is not limited thereto, and the material of the third adhesive layer 18 may also be a pressure-sensitive adhesive. The material of the first buffer layer 19 may be foam, and glue materials are provided on both sides of the foam, to be adhered to the first support back film 15 and the patterned metal layer 20 respectively. That is to say, while the first buffer layer 19 plays a buffering role, it may also play a role of adhering the first support back film 15 and the patterned metal layer 20. It is understood that the sum of the thickness of the foam and the thickness of the glue materials on both sides may be the thickness of the entire first buffer layer 19. The material of the patterned metal layer 20 may include stainless steel, but it is not limited thereto, and it may also be other materials. It should be understood that in an embodiment of the present disclosure, the thickness of the patterned metal layer 20 and its opening pattern may be adjusted for adjusting the elasticity modulus thereof.

Figure 15:
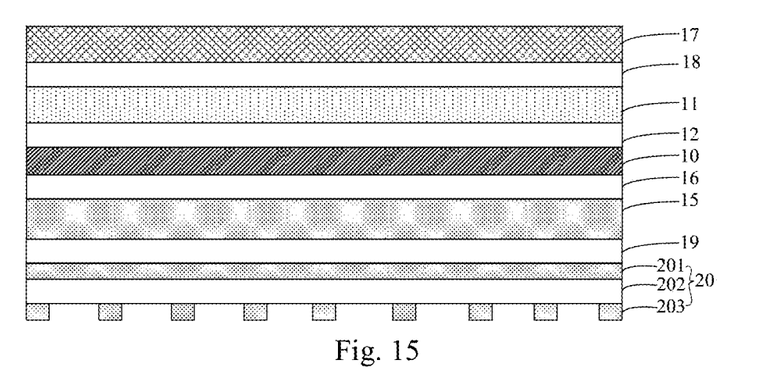
FIG. 15 shows a schematic structural diagram of a flexible display module according to another embodiment.

The patterned metal layer 20 may be a single-layer structure, but not limited thereto, and it may also be a multi-layer composite structure. For example, as shown in FIG. 15, the patterned metal layer 20 may include a first metal layer 201, a sixth adhesive layer 202 located on a side of the first metal layer 201 away from the first buffer layer 19, and a second metal layer located on a side of the sixth adhesive layer 202 away from the first metal layer 201. It should be noted that the first metal layer 201 may be an unpatterned whole film layer; and the second metal layer may be a patterned film layer that has been patterned. In an embodiment of the present disclosure, the thickness of the first metal layer 201, the thickness of the second metal layer or the pattern of the second metal layer may be adjusted for adjusting the elasticity modulus thereof.

Figure 16:
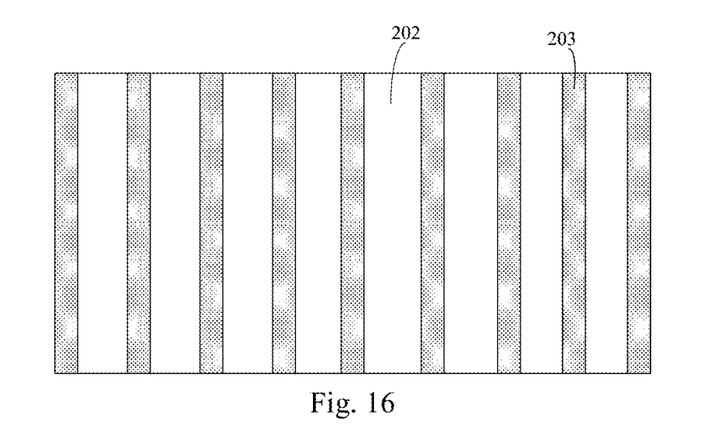
FIG. 16 shows a bottom view of the flexible display module shown in FIG. 15.

Specifically, the second metal layer may include a plurality of metal pattern portions 203 arranged at intervals, and the metal pattern portions 203 extend upward in the curling axis of the flexible display module. This helps to ensure the support performance of the patterned metal layer, and also the good curling properties thereof are guaranteed.

It should be noted that the shape of the metal pattern portion 203 is not limited to the elongated shape shown in FIG. 16, but may also be a square, a circle, an ellipse, a hexagon, an octagon, etc. The arrangement of the metal pattern portions 203 is not limited to that shown in the figures, and may be determined according to actual needs.

The aforementioned first metal layer 201 and the metal pattern portion 203 may be made of stainless steel, but not limited thereto, and they may also be made of other metal materials. The sixth adhesive layer 202 may be a pressure-sensitive adhesive, but not limited thereto, and it may also be other adhesive materials, such as optical adhesives.

In view of above, in an embodiment of the present disclosure, the elasticity modulus of the impact absorption layer 17 and the elasticity modulus of the patterned metal layer 20 may be adjusted and matched, so that the first functional film layer and the second functional film layer are still symmetrical with respect to the flexible display panel 10 as a whole. This not only meets the performance requirements of curling, but also improve the impact resistance of the curling products, such as the pen and ball drop performance.

The flexible display module in Embodiment 3 is compared with the flexible display module in Embodiment 2, and its curling performance and the test results about the pen and ball drop performance are shown in Table 1 below.

TABLE 1

| validation approach | Embodiment 2 | Embodiment 3 |
|---|---|---|
| curling performance | pass | pass |
| pen drop height/mm | 2 | 10 |
| ball drop height/mm | 1.6 | 3.0 |

It can be seen from Table 1 that in the validation process of the curling performance, the curling performances of the flexible display modules of Embodiments 2 and 3 both meet the requirements, that is, passing the test. In the process of pen and ball drop test, the maximum pen drop height of the flexible display module in Embodiment 2 is 2 mm, and the maximum ball drop height is 1.6 mm; while the maximum pen drop height of the flexible display module in Embodiment 3 is 10 mm, and the maximum ball drop height is 3.0 mm. As compared with Embodiment 2, the maximum pen drop height is increased by 5 times, and the maximum ball drop height is increased by about 2 times. Therefore, it can be seen that Embodiment 3 has a better pen and ball drop performance compared with Embodiment 2. Thus, it can be seen that the design method in Embodiment 3 improves the impact resistance at the display side of the flexible display module in a better way. This ensures that the functionality of the flexible display module is not damaged, enhances the mechanical properties and display effects of the flexible display module, and widens the application range and the actual use of the curling module. In the meanwhile, this also provides experience and theoretical guidance for the stacking design of subsequent curling modules.

Embodiment 4

Figure 4:
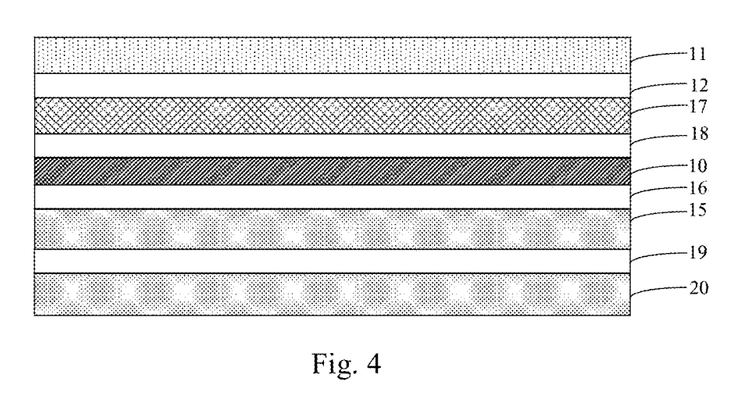

The main difference from Embodiment 3 is in that, the relative positional relationship among the impact absorption layer 17, the flexible cover plate 11 and the flexible display panel 10 is different. Specifically, in Embodiment 3, the impact absorption layer 17 is located on a side of the flexible cover plate 11 away from the flexible display panel 10. While in this Embodiment 4, as shown in FIG. 4, the impact absorption layer 17 is located on a side of the flexible cover plate 11 close to the flexible display panel 10.

It should be noted that, except for the above-mentioned difference between Embodiment 4 and Embodiment 3, other features may be the same as those in Embodiment 3, which will not be repeated here.

It should be understood that in this Embodiment 4, the first functional film layer and the second functional film layer maintain a symmetrical design as a whole, so that the degree of strain accumulation of the key layers of the flexible display panel 10 and the functional film layers on both sides of the flexible display panel 10 with the increasing number of curling turns may be greatly reduced. This helps to alleviate or avoid the peeling of the flexible display panel and the film layer structures on both sides thereof during the curling process. Also, the key layers of the flexible display panel 10 may be alleviated or avoided from breaking and thus failing during the curling process.

Figure 8:
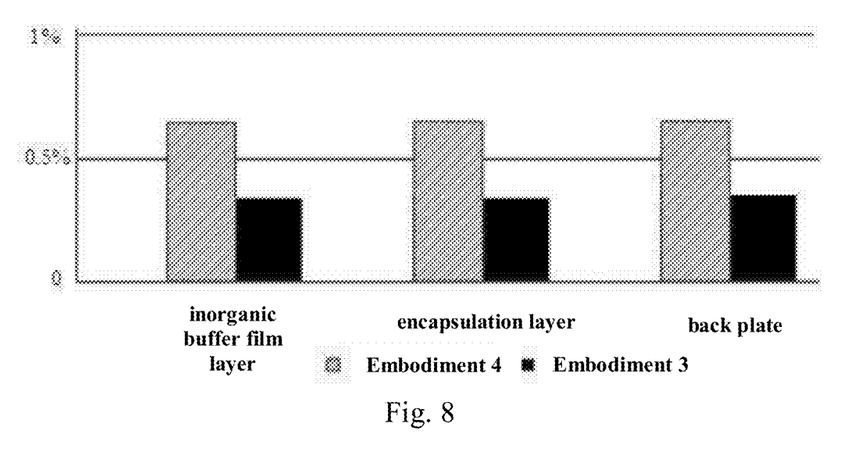
FIG. 8 shows a schematic diagram of the strain simulation results of each functional layer in the flexible display panel of the flexible display module in Embodiments 3 and 4 during the outward curling process.

Studies have shown that in Embodiment 4, the impact absorption layer 17 is placed on a side of the flexible cover plate 11 close to the flexible display panel 10, which is compared with Embodiment 3, where the impact absorption layer 17 is placed on a side of the flexible cover plate 11 away from the flexible display panel 10. In this case, the strain of the key layers in the flexible display panel 10 is likely to increase sharply during the curling process, as shown in FIG. 8, thereby affecting the display effect.

Embodiment 5

The main difference from Embodiment 2 is as follows.

On the basis of Embodiment 2, in addition to the flexible cover plate 11 and the first adhesive layer 12 mentioned in Embodiment 2, the first functional film layer may also include a polarizer 13 and a fourth adhesive layer 14. The polarizer 13 is adhered to the side of the first adhesive layer 12 close to the flexible display panel 10, and is further adhered to the display side of the flexible display panel 10 through the fourth adhesive layer 14. By providing the polarizer 13, the reflection may be reduced, thereby improving the display effect.

Figure 5:
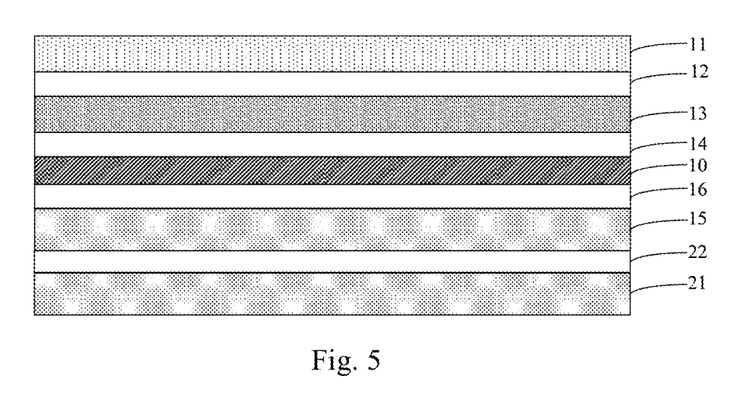

On the basis that the first functional film layer further includes the polarizer 13 and the fourth adhesive layer 14, in order to make the second functional film layer and the first functional film layer in a symmetrical design as a whole with respect to the flexible display panel 10, as shown in FIG. 5, in addition to the first support back film 15 and the second adhesive layer 16 mentioned in Embodiment 2, the second functional film layer in Embodiment 5 of the present disclosure may also include a second support back film 21 and a fifth adhesive layer 22. The second support back film 21 is adhered to the rear side of the first support back film 15 through the fifth adhesive layer 22. By ensuring that the first functional film layer and the second functional film layer maintain a symmetrical design as a whole, the degree of strain accumulation of the key layers of that flexible display panel 10 and the functional film layers on both sides with the increasing number of curling turns may be greatly reduced, so as to alleviate or avoid the peeling of the flexible display panel 10 and the film layer structures on both sides thereof during the curling process. It is also possible to alleviate or avoid the failure of the key layers of the flexible display panel 10 due to breakage during the curling process.

For example, the thickness of the polarizer 13 and the thickness of the second support back film 21 may be from 40 µm to 60 µm, such as 40 µm, 45 µm, 50 µm, 55 µm, 60 µm, etc. The elasticity modulus of the polarizer 13 and the elasticity modulus of the second support back film 21 may be from 4 Gpa to 8 Gpa, such as 4 Gpa, 5 Gpa, 6 Gpa, 7 Gpa, 8 Gpa, etc. This design not only meets the functional requirements of the polarizer 13 and the second support back film 21, but also ensures that the curling performances of the polarizer 13 and the second support back film 21, so as to meet the curling requirements of the entire flexible display module.

The thickness of the fourth adhesive layer 14 and the thickness of the fifth adhesive layer 22 may be from 10 µm to 50 µm, such as 10 µm, 20 µm, 30 µm, 40 µm, 50 µm, etc. The elasticity modulus of the fourth adhesive layer 14 and the elasticity modulus of the fifth adhesive layer 22 may be from 20 Mpa to 100 Mpa, such as 20 Mpa, 40 Mpa, 60 Mpa, 80 Mpa, 100 Mpa, etc. In addition to the adhesive stability of the fourth adhesive layer 14 and the fifth adhesive layer 22, the curling performance of the fourth adhesive layer 14 and the fifth adhesive layer 22 may also be ensured, so as to meet the curling requirements of the entire flexible display module.

For example, the material of the second support back film 21 may be PI organic material, so as to ensure that the first support back film 15 has good flexibility, but the present disclosure is not limited to this. The second support back film 21 may also be made of other materials, depending on the specific applications. The polarizer 13 may be a composite structure, which is determined according to actual needs, and will not be described in detail here. The material of the fourth adhesive layer 14 and the material of the fifth adhesive layer 22 may be optical adhesives or pressure-sensitive adhesives to ensure adhesive stability.

It should be noted that the fourth adhesive layer 14 and the fifth adhesive layer 22 may preferably be pressure-sensitive adhesives, which helps to reduce the cost while ensuring the adhesive stability. In addition, this may also ensure the curling performance of the flexible display module, while reducing the thickness of the flexible display module.

It should be understood that in Embodiment 5, the first functional film layer and the second functional film layer may maintain a symmetrical design as a whole, so that the degree of strain accumulation of the key layers of the flexible display panel 10 and the functional film layers on both sides of the flexible display panel 10 with the increasing number of curling turns may be greatly reduced. This helps to alleviate or avoid the peeling of the flexible display panel and the film layer structures on both sides thereof during the curling process. This may also alleviate or avoid the key layers of the flexible display panel 10 from breaking and thus failing during the curling process.

Embodiment 6

The main difference from Embodiment 5 is as follows.

Figure 6:
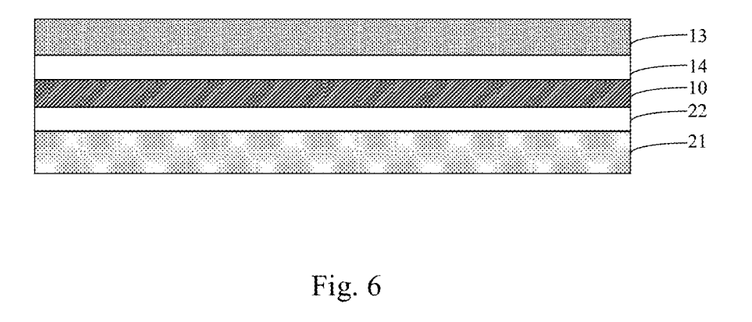

In Embodiment 6, the first functional film layer does not include the flexible cover plate 11 and the first adhesive layer 12, and the second functional film layer does not include the first support back film 15 and the second adhesive layer 16. That is, as shown in FIG. 6, the first functional film layer in Embodiment 6 may only include a polarizer 13 and a fourth adhesive layer 14. The polarizer 13 is adhered to the display side of the flexible display panel 10 through the fourth adhesive layer 14. The second functional film layer may only include the second support back film 21 and the fifth adhesive layer 22. The second support back film 21 is adhered to the rear side of the flexible display panel 10 through the fifth adhesive layer 22.

It should be noted that, with respect to the structures of the polarizer 13, the fourth adhesive layer 14, the second support back film 21, and the fifth adhesive layer 22 in Embodiment 6 of the present disclosure, reference may be made to the contents in Embodiment 5, which will not be repeated here.

It should be understood that in Embodiment 6, the first functional film layer and the second functional film layer may maintain a symmetrical design as a whole, so that the degree of strain accumulation of the key layers of the flexible display panel 10 and the functional film layers on both sides of the flexible display panel 10 with the increasing number of curling turns may be greatly reduced. This helps to alleviate or avoid the peeling of the flexible display panel and the film layer structures on both sides thereof during the curling process. This may also alleviate or avoid the key layers of the flexible display panel 10 from breaking and thus failing during the curling process.

Embodiment 7

Figure 17:
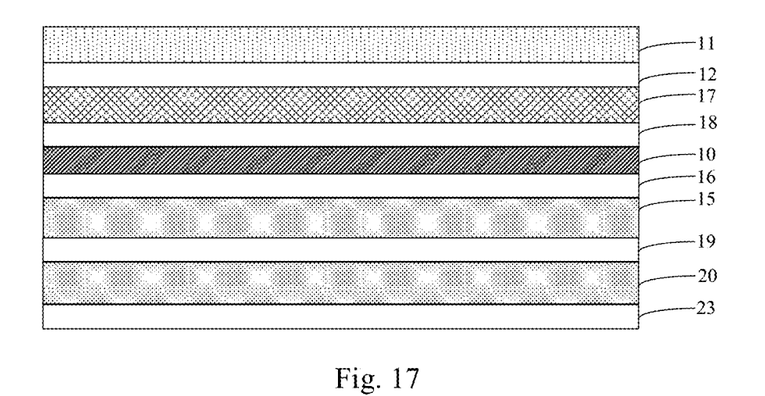
FIG. 17 shows a schematic structural diagram of the flexible display module in Embodiment 7.

The main difference from Embodiment 3 is in that, in addition to the film layers mentioned in Embodiment 3, the second functional film layer, as shown in FIG. 17, may also include a second buffer layer 23. The second buffer layer 23 is located on a side of the patterned metal layer 20 away from the first buffer layer 19. It should be understood that the elasticity modulus of the second buffer layer 23 is smaller than the elasticity modulus of the first support back film 15.

In Embodiment 7, the impact resistance and the support flatness of the flexible display module may be further improved by arranging the second buffer layer 23. In addition, it is convenient to assemble the flexible display module and the whole machine.

It should be noted that, for the material and the thickness of the second buffer layer 23 in Embodiment 7 of the present disclosure, reference may be made to the material and the thickness of the first buffer layer 19 as mentioned above, which will not be repeated here.

In addition, it should be noted that the metal layer between the first buffer layer 19 and the second buffer layer 23 in Embodiment 7 of the present disclosure is not limited to a patterned film layer, and may also be an unpatterned film layer. When it is an unpatterned metal film layer, in order to ensure the overall curling performance, the unpatterned metal film layer may be designed to be thinner.

As can be seen from the contents of the foregoing embodiments, the first functional film layer and the second functional film layer in Embodiment 1 have an asymmetric design as a whole; while the first functional film layer and the second functional film layer in Embodiment 2 to Embodiment 7 is symmetrical in the overall design. The strain accumulation in each embodiment will be described in detail below in conjunction with the accompanying drawings.

Figure 7:
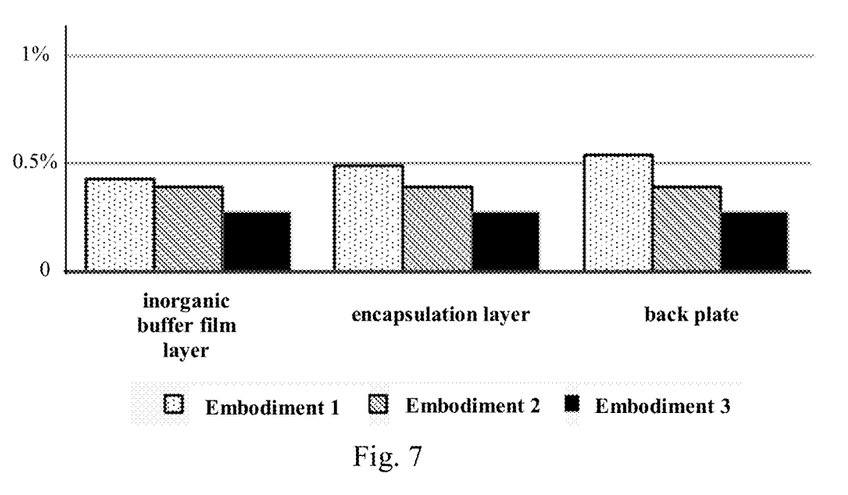
FIG. 7 shows a schematic diagram of the strain simulation results of each functional layer in the flexible display panel of the flexible display module in Embodiments 1 to 3 during the outward curling process.

It can be obtained from FIG. 7 that in Embodiment 1, during the outward curling process of the flexible display module, the strain of the inorganic buffer film layer is about 0.43%, the strain of the encapsulation layer is about 0.49%, and the strain of the back plate is about 0.54%. In Embodiment 2, during the outward curling process of the flexible display module, the strain of the inorganic buffer film layer is about 0.39%, the strain of the encapsulation layer is about 0.39%, and the strain of the back plate is about 0.39%. In Embodiment 3, during the outward curling process of the flexible display module, the strain of the inorganic buffer film layer is about 0.28%, the strain of the encapsulation layer is about 0.28%, and the strain of the back plate is about 0.28%.

It can be seen that the first functional film layer and the second functional film layer in Embodiment 2 and Embodiment 3 are symmetrically designed, and the first functional film layer and the second functional film layer in Embodiment 1 are designed asymmetrically. The strain accumulation of each functional layer of the display panel 10 (i.e., the inorganic buffer film layer, the encapsulation layer and the back plate) is greatly reduced, so as to alleviate or avoid the failure of the functional layers of the flexible display panel 10 due to breakage during the curling process.

It can be obtained from FIG. 8 that in Embodiment 3, during the outward curling process of the flexible display module, the strain of the inorganic buffer film layer is about 0.28%, the strain of the encapsulation layer is about 0.28%, and the strain of the back plate is about 0.28%. In Embodiment 4, during the outward curling process of the flexible display module, the strain of the inorganic buffer film layer is about 0.65%, the strain of the encapsulation layer is about 0.65%, and the strain of the back plate is about 0.65%.

It can be seen from above that, compared with the stacked design of the first functional film layer in Embodiment 3, according to the stacked design of the first functional film layer in Embodiment 4, the strain of each functional layer of the flexible display panel 10 (i.e., the inorganic buffer film layer, the encapsulation layer, and the back plate) increases sharply. Therefore, in Embodiment 3 and Embodiment 4, the laminated design of the first functional film layer in Embodiment 3 is preferred. Thus, the strain accumulation of each functional layer (i.e., the inorganic buffer film layer, the encapsulation layer, and the back plate) of the flexible display panel 10 is greatly reduced, so as to alleviate or avoid the failure of the functional layers of the flexible display panel due to breakage during the curling process, and further improve the impact resistance of the flexible display module.

Figure 9:
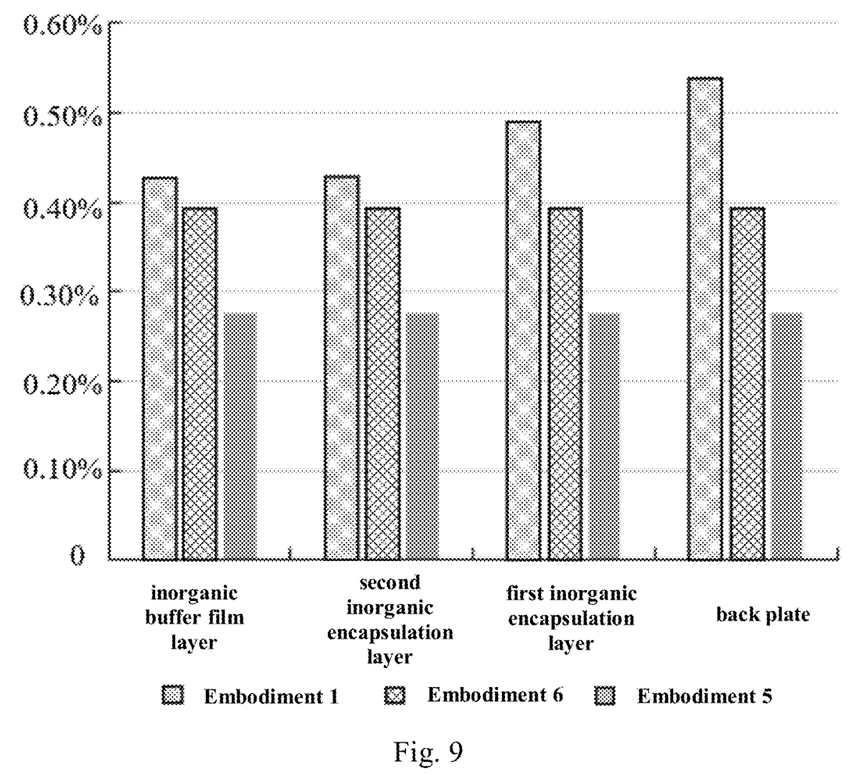
FIG. 9 shows a schematic diagram of the strain simulation results of each functional layer in the flexible display panel of the flexible display module in Embodiment 1, Embodiment 5, and Embodiment 6 during the outward curling process.

It can be obtained from FIG. 9 that in Embodiment 1, during the outward curling process of the flexible display module, the strain of the inorganic buffer film layer is about 0.43%, the strain of the first inorganic encapsulation layer is about 0.49%, the strain of the second inorganic encapsulation layer is about 0.43%, and the strain of the back plate is about 0.54%. In Embodiment 6, during the outward curling process of the flexible display module, the strain of the inorganic buffer film layer is approximately 0.39%, the strain of the first inorganic encapsulation layer is approximately 0.39%, the strain of the second inorganic encapsulation layer is approximately 0.39%, and the strain of the back plate is about 0.39%. In Embodiment 5, during the outward curling process of the flexible display module, the strain of the inorganic buffer film layer is about 0.28%, the strain of the first inorganic encapsulation layer is about 0.28%, the strain of the second inorganic encapsulation layer is about 0.28%, and the strain of the back plate is about 0.28%.

It can be seen that the first functional film layer and the second functional film layer in Embodiment 5 and Embodiment 6 are symmetrically designed, and the first functional film layer and the second functional film layer in Embodiment 1 are designed asymmetrically. The strain accumulation of each functional layer of the display panel 10 (i.e., the inorganic buffer film layer, the encapsulation layer and the back plate) is greatly reduced, so as to alleviate or avoid the failure of the functional layers of the flexible display panel 10 due to breakage during the curling process.

Figure 10:
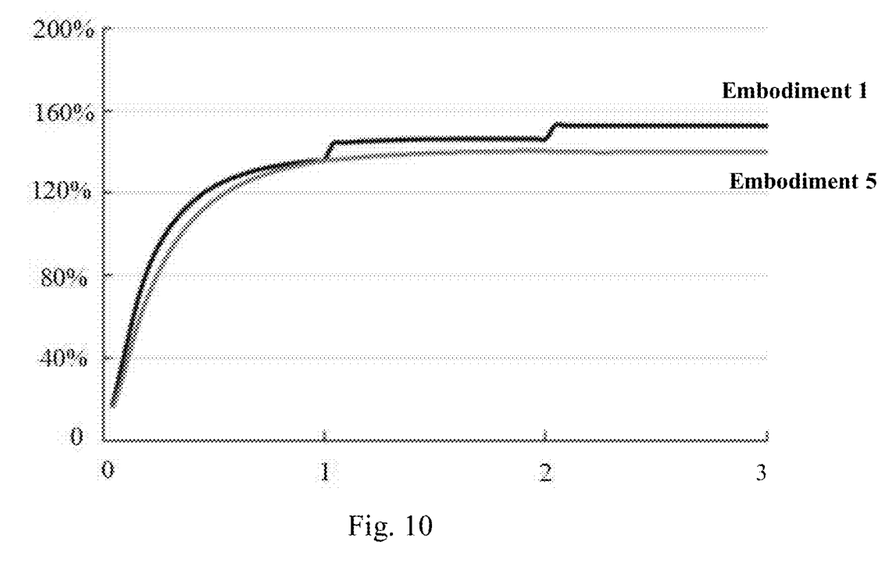
FIG. 10 shows a schematic diagram of the strain simulation results of the first adhesive layer whose material includes OCA under different numbers of turns of the flexible display module in Embodiments 1 and 5 during the outward curling process.
Figure 11:
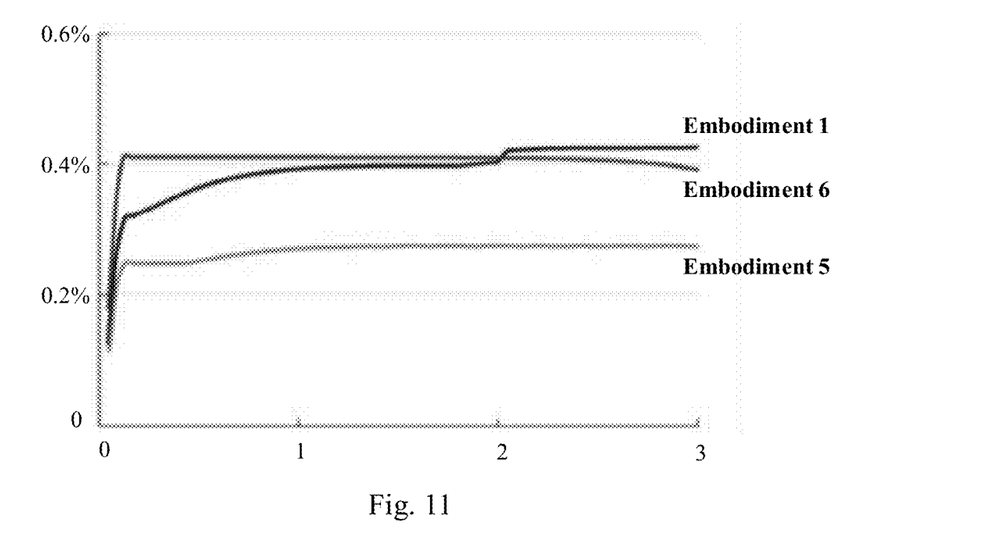
FIG. 11 shows a schematic diagram of the strain simulation results of the inorganic buffer film layer under different numbers of turns of the flexible display module in Embodiment 1, Embodiment 5, and Embodiment 6 during the outward curling process.
Figure 12:
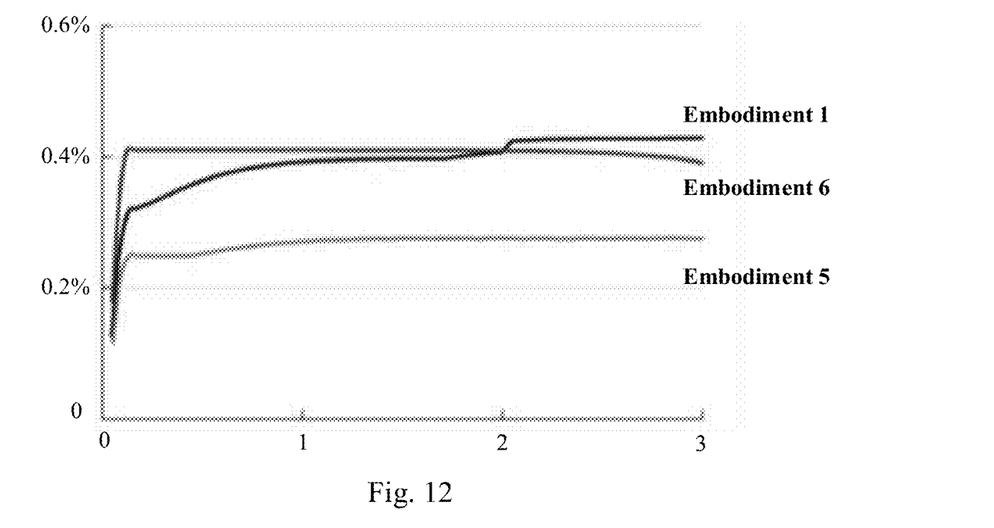
FIG. 12 shows a schematic diagram of the strain simulation results of the second inorganic encapsulation layer under different numbers of turns of the flexible display module in Embodiments 1, 5, and 6 during the outward curling process.
Figure 13:
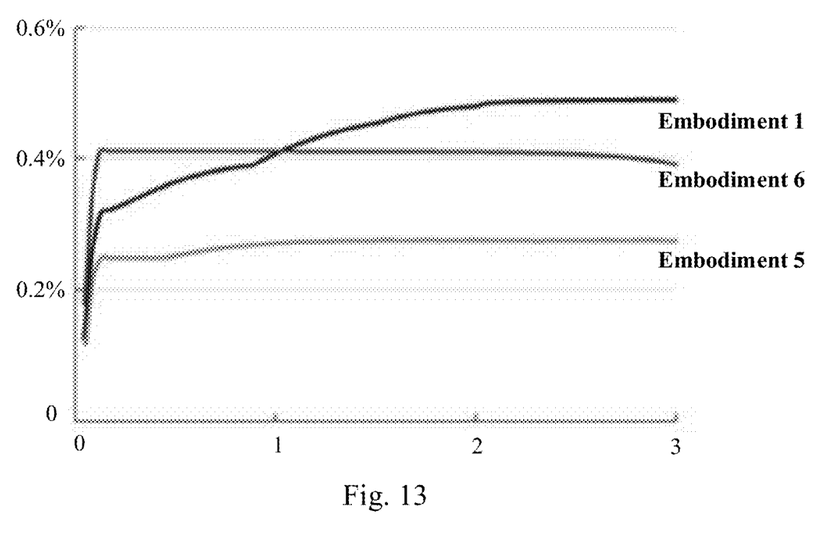
FIG. 13 is a schematic diagram showing the strain simulation results of the first inorganic encapsulation layer under different numbers of turns of the flexible display module in Embodiment 1, Embodiment 5, and Embodiment 6 during the outward curling process.
Figure 14:
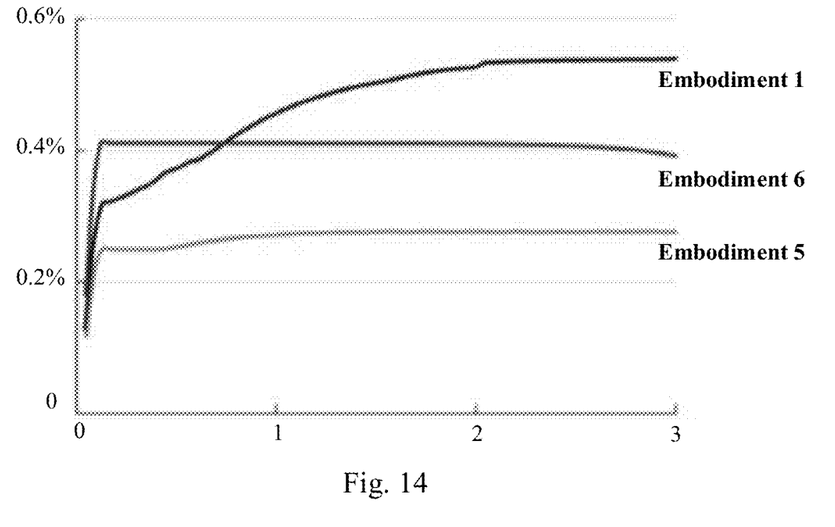
FIG. 14 shows a schematic diagram of the strain simulation results of the backplane under different numbers of turns of the flexible display module in Embodiment 1, Embodiment 5 and Embodiment 6 during the outward curling process.

It can be obtained from FIG. 10 that in Embodiment 1, during the outward curling process of the flexible display module, the strain value of the first adhesive layer 12 using OCA as its material with the increasing number of curling turns is 152.0. In Embodiment 5, during the outward curling process of the flexible display module, the strain value of the first adhesive layer 12 using OCA as its material tends to be 140.0 with the increasing number of curling turns. The strain of the first adhesive layer 12 changes with the number of turns. The strain value in Embodiment 5 is smaller than the strain value in Embodiment 1.

It can be seen that the first functional film layer and the second functional film layer in Embodiment 5 are in symmetrical design, and the first functional film layer and the second functional film layer in Embodiment 1 are in asymmetric design. This helps to alleviate or avoid that during the curling process, the first adhesive layer 12 is likely to be peeled off from the flexible display panel 10, thereby improving the product stability.

It can be obtained from FIG. 11 to FIG. 14 that, the strain of the inorganic buffer film layer, the second inorganic encapsulation layer, the first inorganic encapsulation layer, and the back plate in the flexible display panel 10 changes with the number of turns. The strain values in Embodiment 5 are smaller than the strain values in Embodiments 1 and 6.

It can be seen from above that, compared with the design of the flexible display module in Embodiment 1, the design of the flexible display module in Embodiment 5 helps to greatly reduce the strain accumulation of the functional layers of the flexible display panel 10 (i.e., the inorganic buffer film layer, the encapsulation layer, and the back plate), thereby alleviating or avoiding the situation that the functional layer of the flexible display panel 10 breaks and fails during the curling process.

In view of the foregoing analysis, it can be seen that the structures in Embodiment 3, Embodiment 5 and Embodiment 7 of the present disclosure are best, the structures in Embodiment 2 and Embodiment 6 are better, and the structures in Embodiment 1 and Embodiment 4 are not that good. Therefore, the flexible display modules in Embodiment 3, Embodiment 5, Embodiment 2, and Embodiment 6 are preferred. Compared with the solutions in Embodiment 1 and Embodiment 4, the strain accumulation of each functional layer of the flexible display panel 10 (i.e., the inorganic buffer film layer, the encapsulation layer, and the back plate) is greatly reduced. This helps to alleviate or avoid the failure of the functional layer of the flexible display panel 10 during the curling process due to breakage, and also alleviate or avoid the case where the first adhesive layer 12 is easily peeled off from the flexible display panel 10 during the curling process, thereby improving the product stability. In addition, it can also improve the impact resistance at the display side of the flexible display module to ensure that the functionality of the flexible display module is not damaged. In turn, the mechanical properties and the display effects of the flexible display module can be enhanced, the applicable scope and practical applications of the curling module can be broadened, and experience and theoretical guidance can be provided for the subsequent stacking design of the curling modules.

An embodiment of the present disclosure further provides an electronic device, which includes the flexible display module as described in any of the foregoing embodiments.

It should be noted that, in addition to the aforementioned flexible display module, the electronic device may also include other components and elements, such as batteries, motherboards, casings, etc., which may be supplemented by those skilled in the art according to the specific use of the electronic device, which will not be repeated here.

In embodiments of the present disclosure, the specific type of the electronic device is not particularly limited, and any type of electronic devices commonly used in the art may be used, such as televisions, mobile phones, computers, medical equipment, etc., which may be selected accordingly by those skilled person in the art according to the specific use of the electronic device, and details are not repeated here.

Other embodiments of the present disclosure will readily occur to those skilled in the art upon consideration of the specification and practice of the contents disclosed herein. The present disclosure is intended to cover any variations, uses, or adaptations of the present disclosure that follow the general principle of the present disclosure and include common general knowledge or techniques in the technical field not disclosed by the present disclosure. The specification and examples are to be regarded as exemplary only, with the true scope and spirit of the present disclosure being indicated by the appended claims.

The invention claimed is:

1. A flexible display module, capable of curling, and comprising:
    a flexible display panel, having a display side and a rear side disposed opposite to each other in a thickness direction of the flexible display panel;
    a first functional film layer, formed on the display side of the flexible display panel; and
    a second functional film layer, formed on the rear side of the flexible display panel, wherein
    a ratio of a thickness of the second functional film layer to a thickness of the first functional film layer is from 0.5 to 1.5, and
    a ratio of an elasticity modulus of the second functional film layer to an elasticity modulus of the first functional film layer ratio is from 0.5 to 1.5.

2. The flexible display module according to claim 1, wherein
    in response to the display side of the flexible display panel being closer to an outer curling side than the rear side of the flexible display panel, the ratio of the thickness of the second functional film layer to the thickness of the first functional film layer is from 0.5 to 1, and the ratio of the elasticity modulus of the second functional film layer to the elasticity modulus of the first functional film layer is from 0.5 to 1; or
    in response to the display side of the flexible display panel being closer to an inner curling side than the rear side of the flexible display panel, the ratio of the thickness of the second functional film layer to the thickness of the first functional film layer is from 1 to 1.5, and the ratio of the elasticity modulus of the second functional film layer to the elasticity modulus of the first functional film layer is from 1 to 1.5.

3. The flexible display module according to claim 1, wherein
    the thickness of the second functional film layer is equal to the thickness of the first functional film layer, and the elasticity modulus of the second functional film layer is equal to the elasticity modulus of the first functional film layer.

4. The flexible display module according to claim 1, wherein the elasticity modulus of the first functional film layer and the elasticity modulus of the second functional film layer are from 4 Gpa to 8 Gpa.

5. The flexible display module according to claim 1, wherein
    the first functional film layer comprises a flexible cover plate and a first adhesive layer, the flexible cover plate being adhered to the display side of the flexible display panel through the first adhesive layer; and
    the second functional film layer comprises a first support back film and a second adhesive layer, the first support back film being adhered to the rear side of the flexible display panel through the second adhesive layer.

6. The flexible display module according to claim 5, wherein
    a thickness of the flexible cover plate and a thickness of the first support back film are from 40 μm to 60 μm, and an elasticity modulus of the flexible cover plate and an elasticity modulus of the first support back film are from 4 Gpa to 8 Gpa; and a thickness of the first adhesive layer and a thickness of the second adhesive layer are from 10 μm to 50 μm, and an elasticity modulus of the first adhesive layer and an elasticity modulus of the second adhesive layer are from 20 Mpa to 100 Mpa.

7. The flexible display module according to claim 5, wherein
the first functional film layer further comprises an impact absorption layer and a third adhesive layer, the impact absorption layer being adhered to a side of the flexible cover plate away from the flexible display panel through the third adhesive layer; and
the second functional film layer further comprises a first buffer layer and a patterned metal layer, the first buffer layer being located on a side of the first support back film away from the flexible display panel, and the patterned metal layer being located on a side of the first buffer layer away from the first support back film, wherein
an elasticity modulus of the impact absorption layer is smaller than an elasticity modulus of the flexible cover plate, and an elasticity modulus of the first buffer layer and an elasticity modulus of the patterned metal layer are smaller than an elasticity modulus of the first support back film.

8. The flexible display module according to claim 7, wherein
a thickness of the impact absorption layer is from 100 μm to 200 μm, and an elasticity modulus of the impact absorption layer is from 10 Mpa to 200 Mpa;
a thickness of the third adhesive layer is from 10 μm to 50 μm, and an elasticity modulus of the third adhesive layer is from 20 Mpa to 100 Mpa; and
a thickness of the first buffer layer is from 80 μm to 120 μm, a thickness of the patterned metal layer is from 100 μm to 200 μm, and an elasticity modulus of the first buffer layer and an elasticity modulus of the patterned metal layer are from 10 Mpa to 200 Mpa.

9. The flexible display module according to claim 7, wherein
materials of the flexible cover plate and the first support back film comprise polyimide organic materials;
a material of the impact absorption layer comprises a polyurethane organic material;
materials of the first adhesive layer, the second adhesive layer, and the third adhesive layer comprise optical adhesives or pressure-sensitive adhesives;
a material of the first buffer layer comprises a foam, and glue materials are provided on both sides of the foam to be respectively adhered to the first support back film and the patterned metal layer; and
a material of the patterned metal layer comprises stainless steel.

10. The flexible display module according to claim 7, wherein
the second functional film layer further comprises a second buffer layer, the second buffer layer being located on a side of the patterned metal layer away from the first buffer layer, and an elasticity modulus of the second buffer layer being smaller than an elasticity modulus of the first support back film.

11. The flexible display module according to claim 7, wherein
the patterned metal layer comprises a first metal layer, a sixth adhesive layer located on a side of the first metal layer away from the first buffer layer, and a second metal layer located on a side of the sixth adhesive layer away from the first metal layer; and
the second metal layer comprises a plurality of metal pattern portions arranged at intervals, the metal pattern portions extending upward in a curling axis of the flexible display module.

12. The flexible display module according to claim 5, wherein
the first functional film layer further comprises a polarizer and a fourth adhesive layer, the polarizer being adhered to a side of the first adhesive layer close to the flexible display panel, and further adhered to the display side of the flexible display panel through the fourth adhesive layer; and
the second functional film layer further comprises a second support back film and a fifth adhesive layer, the second support back film being adhered to a rear side of the first support back film through the fifth adhesive layer.

13. The flexible display module according to claim 12, wherein
a thickness of the polarizer and a thickness of the second support back film are from 40 μm to 60 μm, and an elasticity modulus of the polarizer and an elasticity modulus of the second support back film are from 4 Gpa to 8 Gpa; and
a thickness of the fourth adhesive layer and a thickness of the fifth adhesive layer are from 10 μm to 50 μm, and an elasticity modulus of the fourth adhesive layer and an elasticity modulus of the fifth adhesive layer are from 20 Mpa to 100 Mpa.

14. The flexible display module according to claim 13, wherein a material of the second support back film comprises a polyimide organic material, and materials of the fourth adhesive layer and the fifth adhesive layer comprise optical adhesives or pressure-sensitive adhesives.

15. The flexible display module according to claim 1, wherein
the first functional film layer comprises a polarizer and a fourth adhesive layer, the polarizer being adhered to the display side of the flexible display panel through the fourth adhesive layer; and
the second functional film layer comprises a second support back film and a fifth adhesive layer, the second support back film being adhered to the rear side of the flexible display panel through the fifth adhesive layer.

16. An electronic device, comprising a flexible display module,
wherein the flexible display module is capable of curling, and comprises:
a flexible display panel, having a display side and a rear side disposed opposite to each other in a thickness direction of the flexible display panel;
a first functional film layer, formed on the display side of the flexible display panel; and
a second functional film layer, formed on the rear side of the flexible display panel, wherein
a ratio of a thickness of the second functional film layer to a thickness of the first functional film layer is from 0.5 to 1.5, and
a ratio of an elasticity modulus of the second functional film layer to an elasticity modulus of the first functional film layer ratio is from 0.5 to 1.5.

17. The flexible display module according to claim 2, wherein
   the first functional film layer comprises a flexible cover plate and a first adhesive layer, the flexible cover plate being adhered to the display side of the flexible display panel through the first adhesive layer; and
   the second functional film layer comprises a first support back film and a second adhesive layer, the first support back film being adhered to the rear side of the flexible display panel through the second adhesive layer.

18. The flexible display module according to claim 3, wherein
   the first functional film layer comprises a flexible cover plate and a first adhesive layer, the flexible cover plate being adhered to the display side of the flexible display panel through the first adhesive layer; and
   the second functional film layer comprises a first support back film and a second adhesive layer, the first support back film being adhered to the rear side of the flexible display panel through the second adhesive layer.

19. The flexible display module according to claim 4, wherein
   the first functional film layer comprises a flexible cover plate and a first adhesive layer, the flexible cover plate being adhered to the display side of the flexible display panel through the first adhesive layer; and
   the second functional film layer comprises a first support back film and a second adhesive layer, the first support back film being adhered to the rear side of the flexible display panel through the second adhesive layer.

20. The flexible display module according to claim 2, wherein
   the first functional film layer comprises a polarizer and a fourth adhesive layer, the polarizer being adhered to the display side of the flexible display panel through the fourth adhesive layer; and
   the second functional film layer comprises a second support back film and a fifth adhesive layer, the second support back film being adhered to the rear side of the flexible display panel through the fifth adhesive layer.

* * * * *

UNITED STATES PATENT AND TRADEMARK OFFICE
CERTIFICATE OF CORRECTION

PATENT NO. : 12,090,745 B2
APPLICATION NO. : 17/914785
DATED : September 17, 2024
INVENTOR(S) : Jiahao Zhang et al.

Page 1 of 1

It is certified that error appears in the above-identified patent and that said Letters Patent is hereby corrected as shown below:

On the Title Page

(72) Inventors should be changed from "Jiahao Zhang, Beijing(CN); Hong Zhu, Beijing(CN); Xiaofei Luo, Beijing (CN); Zhe Yang, Beijing(CN); Shangchieh Chu, Taiwan(CN)" to
-- Jiahao Zhang, Beijing(CN); Hong Zhu, Beijing(CN); Xiaofei Luo, Beijing (CN); Zhe Yang, Beijing(CN); Shangchich Chu, Beijing(CN) --.

Signed and Sealed this
Twenty-second Day of October, 2024

Katherine Kelly Vidal
*Director of the United States Patent and Trademark Office*